(12) United States Patent
Hamada

(10) Patent No.: US 6,870,753 B2
(45) Date of Patent: Mar. 22, 2005

(54) FERROELECTRIC MEMORY

(75) Inventor: Yasuaki Hamada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/396,371

(22) Filed: Mar. 26, 2003

(65) Prior Publication Data
US 2004/0080990 A1 Apr. 29, 2004

(30) Foreign Application Priority Data
Mar. 27, 2002 (JP) ........................................ 2002-089840

(51) Int. Cl.⁷ .......................... G11C 11/22; G11C 11/24; G11C 16/04
(52) U.S. Cl. .................... 365/145; 365/149; 365/185.03
(58) Field of Search ................................. 365/145, 149, 365/185.03, 185.19

(56) References Cited

U.S. PATENT DOCUMENTS

| | | | | |
|---|---|---|---|---|
| 3,585,610 A | * | 6/1971 | Bartlett et al. ............... | 365/145 |
| 3,623,031 A | * | 11/1971 | Kumada ...................... | 365/145 |
| 5,901,089 A | * | 5/1999 | Korsh et al. ............ | 365/185.03 |
| 6,363,002 B1 | * | 3/2002 | Nishimura et al. .......... | 365/145 |
| 6,639,823 B2 | * | 10/2003 | Hasegawa .................... | 365/145 |

FOREIGN PATENT DOCUMENTS

| | | |
|---|---|---|
| JP | A-8-124378 | 5/1996 |
| JP | A-2002-230967 | 8/2002 |

* cited by examiner

Primary Examiner—Trong Phan
(74) Attorney, Agent, or Firm—Oliff & Berridge, PLC

(57) ABSTRACT

A ferroelectric memory capable of multi-value memory retention is provided which hardly modifies a related art circuit. The period for which a write pulse is applied changes depending upon a value to be stored, so that multi-value value storage is attained. Only one voltage is prepared for the write pulse, and a reset or read pulse and the write pulse have the same voltage, thus achieving a ferroelectric memory having a multi-value storage function using only one voltage source.

6 Claims, 4 Drawing Sheets

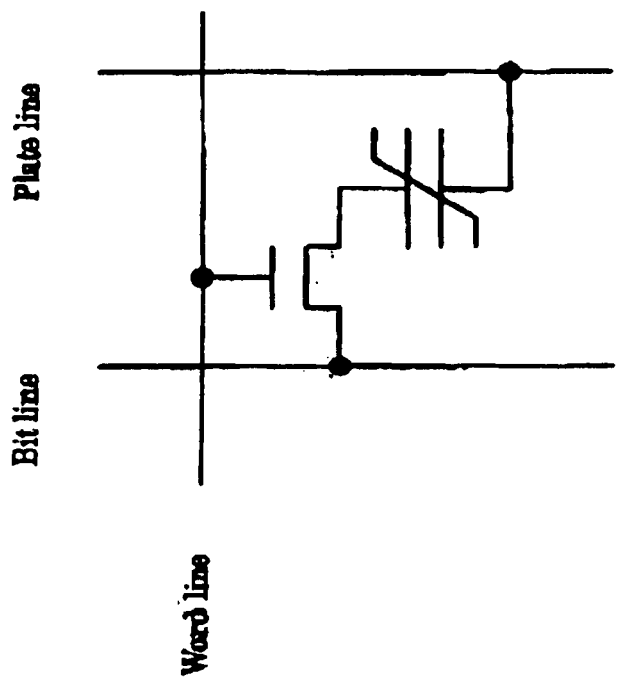

FERROELECTRIC MEMORY

BACKGROUND OF THE INVENTION

1. Field of Invention

The present invention relates to a ferroelectric memory. More particularly, the invention relates to a ferroelectric memory to store multiple values equal to or more than three values in a single memory cell.

2. Description of Related Art

A ferroelectric memory having a ferroelectric capacitor that is usable as a storage device has an operation speed as high as that of a DRAM, and is non-volatile like a FLASH memory. Due to such characteristics, the ferroelectric memory that is usable as a memory device may replace traditional memories.

A related art memory device (1T1C structure, such as the example shown in FIGS. 3(a) and 3(b)), like a DRAM, is configured such that a single memory cell is formed of a transistor and a capacitor made of a ferroelectric material to ensure memory retention, and another memory device (2T2C structure) is configured such that another combination of a transistor and a capacitor for reference is added to each memory cell. In view of high integration technology in the future, however, the 1T1C OR 2T2C structure has a limit. Accordingly, some approaches have been investigated to enhance the integration scale. One approach is to study smaller-sized memory devices. A ferroelectric memory (1C structure) can be provided in which a single memory cell is formed of one ferroelectric capacitor alone, and a ferroelectric memory (1T structure) can be provided in which a single memory cell is formed of one transistor alone, the gate electrode of which includes a ferroelectric capacitor, such that storage of the ferroelectric capacitor causes the transistor to be turned on or off. Another approach is to enhance the integration scale by providing a memory capacity of three or more values for each ferroelectric memory cell.

The related art also includes methods of attaining multi-value storage, including a method disclosed in Japanese Unexamined Patent Application Publication No. 8-180673 in which a plurality of ferroelectric capacitors having different threshold voltages are connected in parallel to form a memory cell such that capacitors with the reverse polarization direction among the ferroelectric capacitors are differentiated in number to attain multi-value storage, and a method disclosed in Japanese Unexamined Patent Application Publication No. 8-124378 in which a voltage applied to a ferroelectric memory cell is controlled to produce a third intermediate storage state different from the saturated positive and negative polarization states. However, in the former method, since a single memory cell includes a plurality of ferroelectric capacitors, the size of the memory cell increases as the magnitude of multiple values increases. In the latter method, since the applied voltage varies depending upon the value to be stored, the size of a peripheral circuit inevitably increases as the magnitude of multiple values increases.

SUMMARY OF THE INVENTION

In order to address or overcome the foregoing and/or other drawbacks, a ferroelectric memory of a first aspect of the present invention is provided such that multiple values are stored according to different periods for which a write pulse is applied.

According to the above-noted feature, since it is easier to produce the intermediate state of reverse polarization than to control the applied voltage, multi-value storage using the intermediate state of reverse polarization can be relatively easily attained.

A ferroelectric memory of a second aspect of the present invention is provided such that the write pulse has a constant voltage regardless of a value to be stored.

According to the above-noted feature, advantageously, only one level of the applied voltage is required regardless of the magnitude of multiple values, thus making it possible to manufacture a multi-value ferroelectric memory while hardly modifying the size of a peripheral circuit.

A ferroelectric memory of a third aspect of the present invention is provided such that the above-described write or rewrite operation is performed by continuously applying two pulses: (1) a pulse, for a reset or read operation, having a sufficient voltage and period for reversing the ferroelectric memory cell, and (2) a pulse, for a write operation, having a period dependent upon a value to be stored at a polarity reverse to that of the pulse for the reset or read operation.

With the above-noted feature, the two pulses ensure multi-value storage, thus achieving efficient multi-value storage. In addition, the multi-value storage is always performed in the state where the directions of polarization are the same, and the multi-value storage can therefore be stably performed.

A ferroelectric memory of a fourth aspect of the present invention is provided such that the pulse for the reset or read operation and the pulse for the write operation have reverse polarities and the same voltage.

According to the above-noted feature, advantageously, only one type of voltage source is required like the ferroelectric memory of the related art, and multi-value storage can be performed with hardly modifying the circuit of the ferroelectric memory of the related art.

The ferroelectric memory of the present invention provides advantages, including the fact that multi-value storage can be relatively easily performed and can be supported using the circuit of the ferroelectric memory of the related art with little modification.

BRIEF DESCRIPTION OF THE DRAWINGS

FIG. 3(a) illustrates an example of a ferroelectric memory and single memory cell memory.

DETAILED DESCRIPTION OF PREFERRED EMBODIMENTS

In the present invention, a multi-value ferroelectric memory uses bipolar polarization states of a ferroelectric material and the intermediate state therebetween. Any kind of memory cell may be used as long as stored data is read according to the difference in the amount of response charge with respect to a read-out pulse. Thus, not only the 1T1C structure or 2T2C structure of the related art but also the 1C structure may use the method of the present invention. The 1T structure also utilizes the polarization state of a ferroelectric capacitor, and can therefore use the method of the present invention.

In the method of the present invention, there is no limitation in particular to the kind of ferroelectric material. Preferably, a material which provides lower modification or loss of the stored content is used.

Exemplary details of the present invention are described below with reference to the drawings.

EXAMPLE 1

Figure 1:
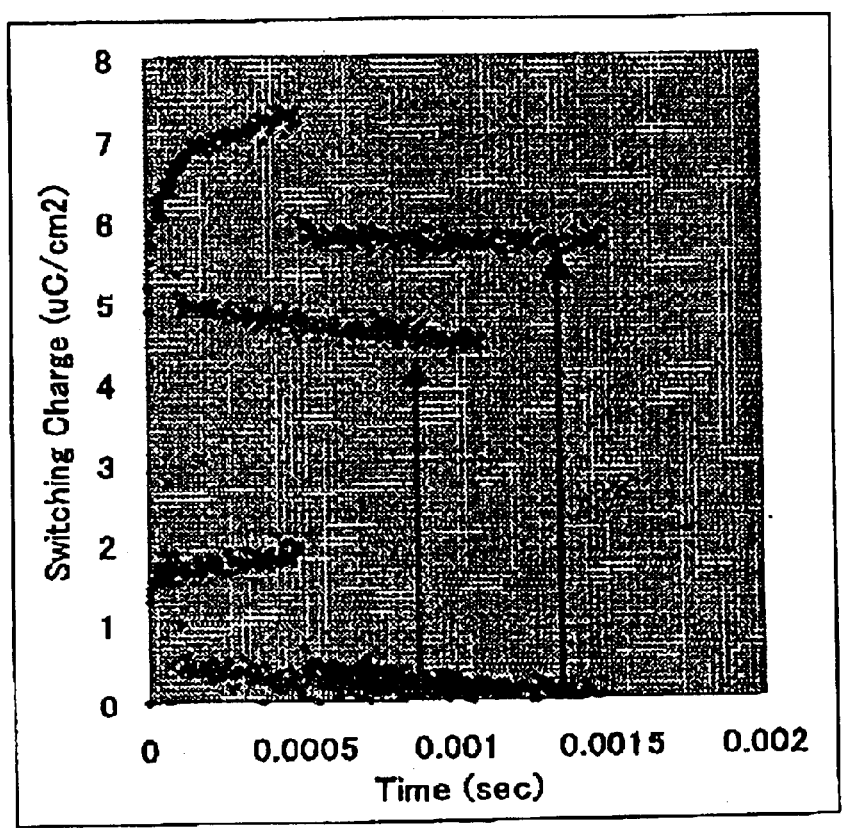
FIG. 1 is a graph showing the principle of a multi-value memory according to the present invention.

FIG. 1 is a graph showing the principle of a multi-value memory according to the present invention. In the Example, a pulse having a voltage of 1.8 V was applied to a ferroelectric capacitor having a coercive voltage of 0.9 V to perform a write operation, and the amount of reverse polarization was compared while changing the period for which the pulse is applied. As a result, it is found that the amount of reverse polarization differs depending on the difference in period for which the pulse is applied. As shown in FIG. 1, the switching charge is a function of time. Two levels of reverse polarization ("1" and "2") correspond to two periods for which the pulse is supplied. The two levels depicted in FIG. 1 and one level without reverse polarization, i.e., a total of three levels, can be used to store three values.

EXAMPLE 2

Figure 2:
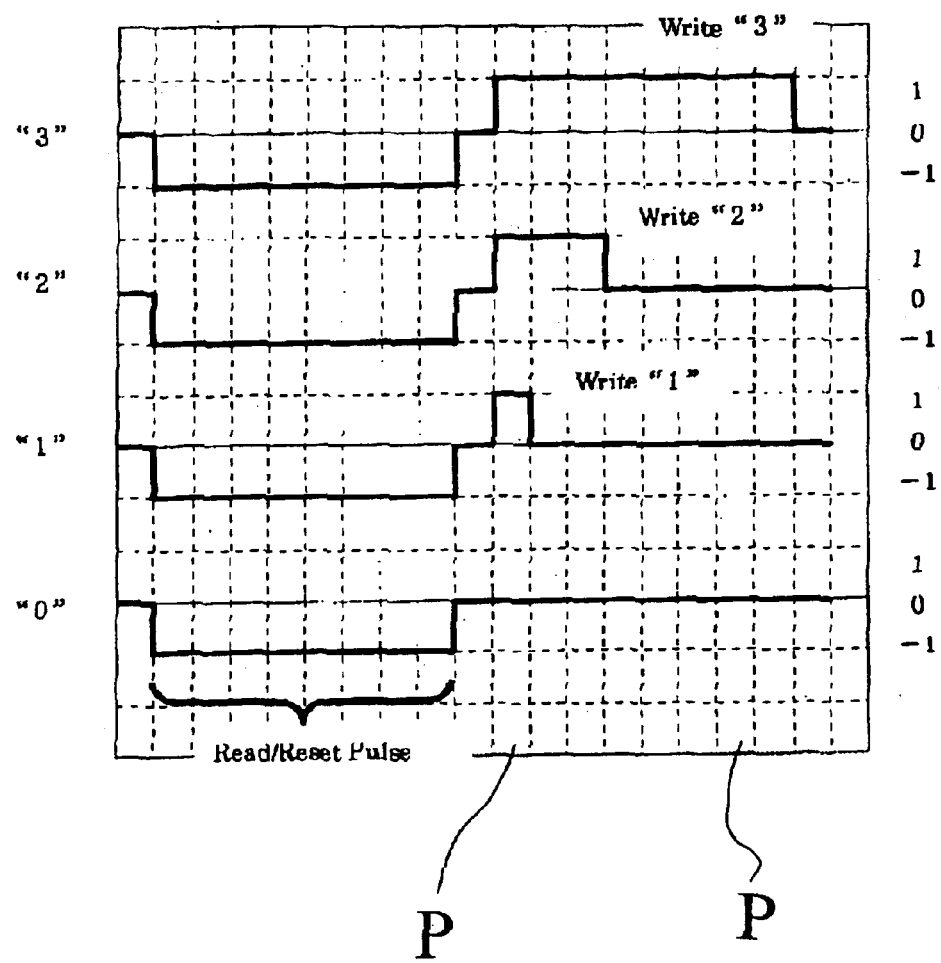
FIG. 2 is a time chart showing an exemplary write operation sequence of a ferroelectric memory according to the present invention.
Figure 3B:
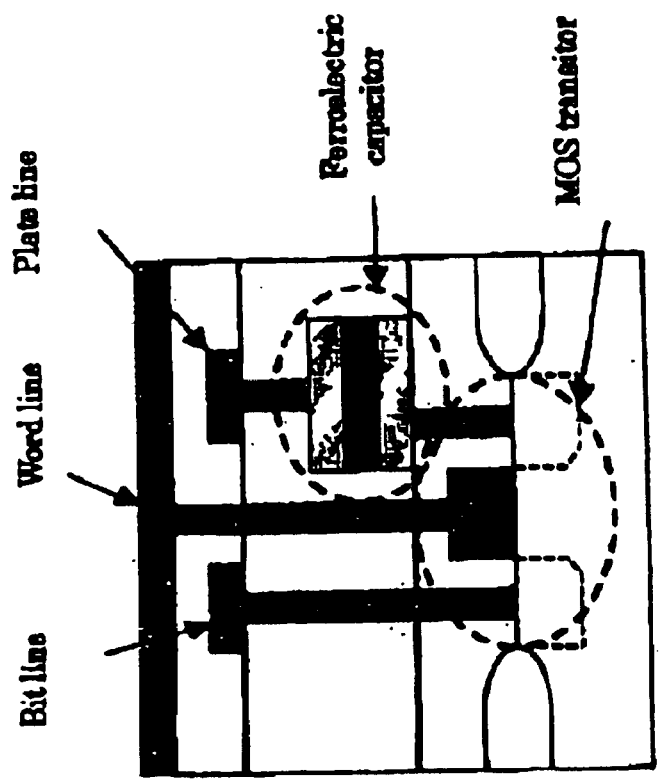
FIG. 3(b) illustrates a cross section of the ferroelectric memory and single memory cell of FIG. 3(a).

FIG. 2 is a time chart showing an exemplary write operation sequence of the ferroelectric memory according to the present invention. First, a "read/reset pulse" having a sufficient pulse width is applied so that the memory is brought into a state where polarization is saturated in one direction ("−1"). Then, a "write" pulse having a polarity reverse ("1") to that of the above pulse and having different periods (write "1", write "2" and "write 3", actively) depending upon values to be stored is applied to produce the polarization states corresponding to the values, so that the information is stored. Preferably, the pulse width of the write pulse corresponding to each value is defined as an integer multiple of a certain unit time P. Preferably, the pulse width of the reset or read pulse is set to the pulse width as that of the write pulse having the longest pulse width.

What is claimed is:

1. A ferroelectric memory, comprising:
a single memory cell capable of storing at least three values, the at least three values being stored according to different periods for which a write pulse is applied, the write pulse having a pulse width comprising a plurality of unit time lengths, each of the different periods being an integer multiple of the unit time lengths.

2. The ferroelectric memory according to claim 1, the write pulse having a constant voltage regardless of a value to be stored.

3. The ferroelectric memory according to claim 1, a write or rewrite operation being performed by continuously applying two pulses including: (1) a pulse, for a reset or read operation, having a sufficient voltage and period to reverse the ferroelectric memory cell, and (2) a pulse, for a write operation, having a period dependent upon a value to be stored at a polarity reverse to that of the pulse for the reset or read operation.

4. The ferroelectric memory according to claim 3, the pulse for the reset or read operation and the pulse for the write operation having reverse polarities and the same voltage.

5. The ferroelectric memory according to claim 1, the different periods having different pulse widths.

6. The ferroelectric memory according to claim 1, the different periods representing different time durations for which the write pulse is applied.

* * * * *